United States Patent
Shen

(10) Patent No.: US 9,983,828 B2
(45) Date of Patent: May 29, 2018

(54) HEALTH INDICATOR OF A STORAGE DEVICE

(71) Applicant: SANDISK TECHNOLOGIES LLC, Plano, TX (US)

(72) Inventor: Zhenlei Shen, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 310 days.

(21) Appl. No.: 14/510,687

(22) Filed: Oct. 9, 2014

(65) Prior Publication Data

US 2016/0103630 A1    Apr. 14, 2016

(51) Int. Cl.

| | |
|---|---|
| G06F 3/00 | (2006.01) |
| G06F 3/06 | (2006.01) |
| G06F 11/00 | (2006.01) |
| G11C 16/34 | (2006.01) |
| G11C 29/02 | (2006.01) |
| G11C 29/42 | (2006.01) |
| G11C 29/52 | (2006.01) |
| G11C 29/04 | (2006.01) |

(52) U.S. Cl.
CPC .......... *G06F 3/0653* (2013.01); *G06F 3/0616* (2013.01); *G06F 3/0619* (2013.01); *G06F 3/0679* (2013.01); *G06F 11/008* (2013.01); *G11C 16/349* (2013.01); *G11C 29/028* (2013.01); *G11C 29/42* (2013.01); *G11C 29/52* (2013.01); *G11C 2029/0411* (2013.01)

(58) Field of Classification Search
CPC .................................................... G06F 11/008
See application file for complete search history.

(56) References Cited

U.S. PATENT DOCUMENTS

| | | | |
|---|---|---|---|
| 7,237,074 B2 | 6/2007 | Guterman et al. | |
| 7,356,442 B1* | 4/2008 | Astigarraga | G06F 11/008 |
| | | | 702/182 |
| 7,861,122 B2 | 12/2010 | Cornwell et al. | |
| 8,402,242 B2* | 3/2013 | Hu | G06F 12/0246 |
| | | | 711/165 |
| 8,719,660 B2 | 5/2014 | Peng et al. | |
| 2005/0262168 A1* | 11/2005 | Helliker | G06F 11/1446 |
| 2008/0086275 A1 | 4/2008 | Astigarraga et al. | |
| 2009/0077434 A1 | 3/2009 | Furuhjelm et al. | |
| 2013/0047044 A1* | 2/2013 | Weathers | G11C 16/3459 |
| | | | 714/708 |
| 2013/0191700 A1 | 7/2013 | Griffin et al. | |
| 2014/0164674 A1 | 6/2014 | Verhaeghe et al. | |
| 2015/0324148 A1* | 11/2015 | Achtenberg | G06F 11/1012 |
| | | | 711/103 |

(Continued)

OTHER PUBLICATIONS

Cai et al., Error Patterns in MLC NAND Flash Memory: Measurement, Characterization, and Analysis 2012.*

(Continued)

*Primary Examiner* — Bryce Bonzo
*Assistant Examiner* — Katherine Lin
(74) *Attorney, Agent, or Firm* — Kunzler, PC

(57) ABSTRACT

A data storage device may perform a method that includes identifying a first life stage of multiple life stages of the data storage device. The method includes determining a first health scheme based on the first life stage and generating a first health indicator associated with a region of the memory based on the first health scheme.

30 Claims, 6 Drawing Sheets

(56) References Cited

U.S. PATENT DOCUMENTS

2016/0077964 A1* 3/2016 Chang ............... G06F 12/0253
　　　　　　　　　　　　　　　　　　　　　　　711/103

OTHER PUBLICATIONS

D'Abreu, Manuel Antonio et al. "Tracking Erase Operations to Regions of Non-Volatile Memory," U.S. Appl. No. 13/800,224, filed Mar. 13, 2013, 24 pages.

D'Abreu, Manuel Antonio et al. "Tracking Erase Pulses for Non-Volatile Memory," U.S. Appl. No. 13/800,430, filed Mar. 13, 2013, 30 pages.

D'Abreu, Manuel Antonio et al. "Tracking Cell Erase Counts of Non-Volatile Memory," U.S. Appl. No. 13/800,637, filed Mar. 13, 2013, 32 pages.

Presman, Noam et al. "Storage Module and Low-Complexity Methods for Assessing the Health of a Flash Memory Device," U.S. Appl. No. 13/926,709, filed Jun. 25, 2013, 27 pages.

* cited by examiner

HEALTH INDICATOR OF A STORAGE DEVICE

FIELD OF THE DISCLOSURE

The present disclosure is generally related to a health indicator of a storage device.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the devices to store and provide rapid access to a large amount of data.

A data storage device may include a health metering system that determines a "health" of blocks included in a memory of the data storage device. Conventional health metering systems use a static health evaluation method throughout a life of the data storage device to enable the data storage device to make decisions related to storage location selection, wear leveling, garbage collection, and/or other operations associated with the memory, as illustrative, non-limiting examples. For example, the static health evaluation method may be based on a program/erase count and/or a bit error rate. However, a static health evaluation method does not account for changing conditions of a memory of the data storage device and changing priorities related to use of the memory that manifest throughout a life of the data storage device.

SUMMARY

A system is configured to use a dynamic health assessment method to evaluate a health status (e.g., generate a health indicator) associated with a memory of a data storage device. An endurance (e.g., a data storage life) of the memory, such as an endurance of a block and/or a die of the memory, may be divided into multiple "life" stages. Each life stage may be associated with different priorities related to use of the memory during the life stage. The system may identify a particular life stage associated with the memory and may evaluate a health status of the memory based on the particular life stage. For example, based on the memory being in a first life stage associated with a beginning-of-life condition of the memory, a first health scheme may be applied that emphasizes a program/erase count to determine a health status associated with the memory. As another example, based on the memory being in a second life stage associated with an end-of-life condition of the memory, a second health scheme may be applied that emphasizes a failed bit count to determine the health status associated with the memory.

By evaluating the health status based on the particular life stage, the system may be able to account of changing conditions and changing priorities associated with the memory as the memory is used (e.g., as the memory stores and maintains data over time). For example, based on the particular life stage of the memory, the system may consider and/or emphasize factors (e.g., one or more metrics) that correspond to the particular life stage, such as emphasizing a lower program erase count during the first life stage to promote regular use of each block of the memory and emphasizing a failed bit count at the second life stage to push blocks to their operational limit. By accounting for the conditions and priorities during each life stage, the system may improve use of the memory during each life stage to reduce power consumption, shorten program and erase times, increase data retention, increase reliability, and/or increase operating life of the memory.

DETAILED DESCRIPTION

Particular implementations are described with reference to the drawings. In the description, common features are designated by common reference numbers throughout the drawings.

Figure 1:
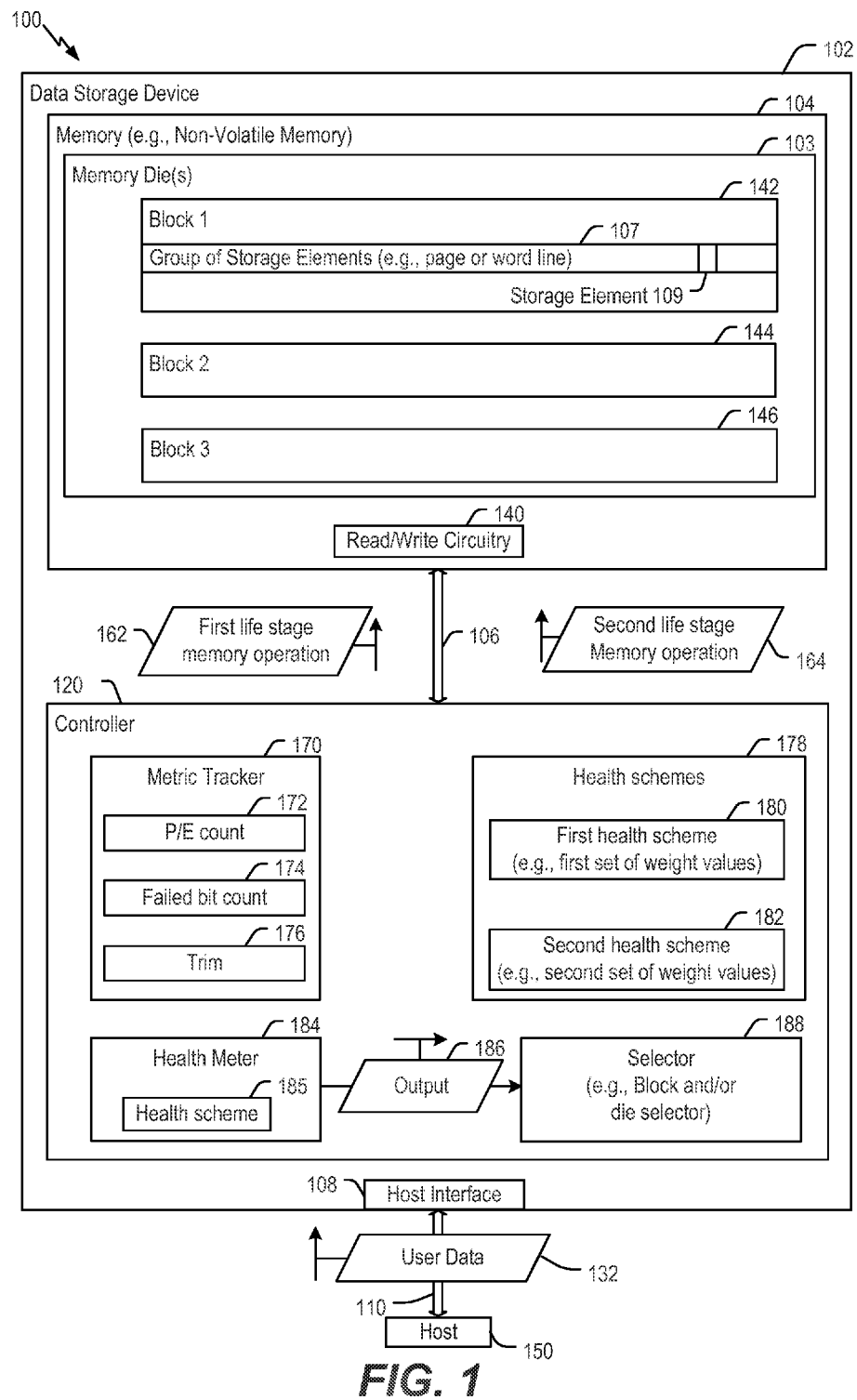
FIG. 1 is a block diagram of a particular illustrative embodiment of a system including a data storage device configured to determine a health of the data storage device.

Referring to FIG. 1, a particular illustrative embodiment of a system is depicted and generally designated 100. The system 100 includes a data storage device 102 and a host device 150. The data storage device 102 includes a controller 120 and a memory 104, such as a non-volatile memory, that is coupled to the controller 120. The controller 120 may be configured to determine one or more health indicators (e.g., health statuses) associated with the memory 104. As used herein, "health" is used to indicate an amount and/or a type of use or wear of a system or a device, such as a memory and/or components thereof. The health of a system or a device may provide an indication and/or a prediction of an endurance of the system or the device and may be representative of an amount of wear or a decrease in (e.g., a degradation of) a storage capability of the system or the device. A health indicator may include or correspond to a value that is representative of a health of a region of the memory 104 (e.g., a health of a storage element, a page, a wordline, a block, a die, or a meta block) or a health of the memory 104 as a whole. For example, the value of the health indicator may be a numerical value (e.g., a scaled value or a relative value) or a descriptive value (e.g., very healthy, healthy, slightly unhealthy, unhealthy), as illustrative, non-limiting examples. To illustrate, a first region (e.g., a first block) of the memory 104 may correspond to a first health indicator (e.g., "healthy") and a second region (e.g., a second block) of the memory may correspond to a second health indicator (e.g., "unhealthy"), where the first region may be determined to be healthier than the second region based on a comparison of the first health indicator to the second health indicator.

The controller 120 may be configured to determine one or more health indicators associated with a memory system (e.g., a health indicator of a storage element of the memory 104, a health indicator of a page of the memory 104, a health indicator of a wordline of the memory 104, a health indicator of a block of the memory 104, a health indicator of a die of the memory 104, a health indicator of a meta block of the memory 104, or a health indicator of the memory 104 as a system) based on a "life" stage of the memory 104. As used herein, "life" of the memory 104 corresponds to a duration of use of the memory 104 from a first data storage operation until an end-of-life condition is met, such as when an amount of wear on the memory 104 causes the data storage device 102 to be unable to reliably store and retrieve data for the host device 150. For example, an endurance of the memory 104 (e.g., a life of the memory 104 in terms of a capability of the memory 104 to reliably store and maintain data) may be divided into multiple life stages, such as a beginning-of-life stage and an end-of-life stage, as illustrative, non-limiting examples. The controller 120 may be configured to determine which stage of the multiple life stages is associated with the memory 104 based on at least one metric, such as a program/erase count metric, a data received metric, a data written metric, or a combination thereof, as illustrative, non-limiting examples.

The controller 120 may apply a health scheme to determine one or more health indicators associated with the memory 104 (e.g., a health indicator of a storage element of the memory 104, a health indicator of a block of the memory 104, a health indicator of a die of the memory 104, and/or a health indicator of the memory 104 as a system). For example, the controller 120 may select a particular set of weight values based on a particular stage of the multiple life stages and may apply the health scheme using the particular set of weight values to determine the one or more health indicators. As another example, the controller 120 may select a particular health scheme of multiple health schemes based on a particular stage of the multiple life stages and may apply the particular health scheme to determine the one or more health indicators. The one or more health indicators may be used by the controller 120 to select a region of the memory 104, such as one or more storage elements, one or more pages, one or more wordlines, one or more blocks, one or more dies, and/or one or more meta blocks, to be used for a memory operation, such as a write operation, a wear leveling operation, a garbage collection operation, and/or a background scan operation, as illustrative, non-limiting examples.

Each health scheme may use one or more metrics to determine the one or more health indicators. Additionally, each health scheme may include or correspond to a set of weight values that are applied to the one or more metrics and that may be associated with a different use priority. For example, when the memory 104 is associated with the beginning-of-life stage, the controller 120 may use a first health scheme (e.g., a first set of weight values) to determine the one or more health indicators associated with the memory 104. The first health scheme may be configured to emphasize a number of program/erase cycles (e.g., a program/erase count) to determining the one or more health indicators. As another example, when the memory 104 is associated with the end-of-life stage, the controller may use a second health scheme (e.g., a second set of weight values) to determine a health indicator associated with the memory 104. The second health scheme may be configured to emphasize a failed bit count (e.g., a failed bit count associated with a storage element, a page, a wordline, a block, a die, a meta block, and/or an entirety of the memory 104) to determining the health status.

By determining a life stage associated with the memory 104, the controller 120 may selectively use a health scheme and/or apply one or more weight values and, thus, may dynamically determine the one or more health indicators associated with the memory 104 based on changing conditions that affect the memory 104. Additionally, each health scheme and/or each set of one or more weight values, may be configured to address memory usage priorities that correspond to the health scheme (e.g., the life stage). Accordingly, each health scheme and/or each set of weight values may promote use of the memory 104 during the corresponding life stage.

The data storage device 102 and the host device 150 may be operationally coupled via a connection (e.g., a communication path 110), such as a bus or a wireless connection. The data storage device 102 may be embedded within the host device 150, such as in accordance with a Joint Electron Devices Engineering Council (JEDEC) Solid State Technology Association Universal Flash Storage (UFS) configuration. Alternatively, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, as illustrative, non-limiting examples.

The data storage device 102 may be configured to be coupled to the host device 150 via a communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

For example, the data storage device 102 may be configured to be coupled to the host device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The host device 150 may include a processor and a memory. The memory may be configured to store data and/or instructions that may be executable by the processor. The memory may be a single memory or may include one or more memories, such as one or more non-volatile memories, one or more volatile memories, or a combination thereof. The host device 150 may issue one or more commands to the data storage device 102, such as one or more requests to erase, read data from, or write data to the memory 104 of the data storage device 102, as illustrative, non-limiting examples. For example, the host device 150 may be configured to provide data, such as user data 132, to be stored at the memory 104 or to request data to be read from the memory 104. The host device 150 may include a mobile telephone, a music player, a video player, a gaming console, an electronic book reader, a personal digital assistant (PDA), a computer, such as a laptop computer or notebook computer, any other electronic device, or any combination thereof, as illustrative, non-limiting examples.

The host device 150 communicates via a memory interface that enables reading from the memory 104 and writing to the memory 104. For example, the host device 150 may operate in compliance with a Joint Electron Devices Engineering Council (JEDEC) industry specification, such as a Universal Flash Storage (UFS) Host Controller Interface specification. As other examples, the host device 150 may operate in compliance with one or more other specifications, such as a Secure Digital (SD) Host Controller specification, as an illustrative, non-limiting example. The host device 150 may communicate with the memory 104 in accordance with any other suitable communication protocol.

The memory 104 of the data storage device 102 may include a non-volatile memory. The memory 104 may have a three-dimensional (3D) memory configuration. Alternatively, the memory 104 may have another configuration, such as a two-dimensional (2D) memory configuration. The memory 104 may include one or more memory dies 103. Each of the one or more memory dies 103 may include one or more blocks (e.g., one or more erase blocks). For example, a particular memory die of the one or more memory dies 103 may include the blocks 142-146. Although three blocks are illustrated in FIG. 1, the particular memory die may include more than three blocks or less than three blocks. Each of the blocks 142-146 may include one or more groups of storage elements, such as a representative group of storage elements 107 included in the block 142. The group of storage elements 107 may be configured as a page or a word line. The group of storage elements 107 may include multiple storage elements (e.g., memory cells), such as a representative storage element 109.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 may also be configured to send data and commands to the memory 104 associated with background scanning operations, garbage collection operations, and/or wear leveling operations, as illustrative, non-limiting examples. The controller 120 is configured to send a read command to the memory 104 to access data from a specified address of the memory 104. The read command may specify the physical address of a portion of the memory 104 (e.g., a physical address of a word line of the memory 104).

The controller 120 may include a metric tracker 170, health schemes 178, a health meter 184, and a selector 188. The metric tracker 170 may be configured to track one or more metrics associated with the memory 104. The metric tracker 170 may be configured to track the one or more metrics for the memory 104 as a whole and/or on a storage element-by-storage element basis, on a page-by-page basis, on a wordline-by-wordline basis, on a block-by-block basis, on a die-by-die basis, and/or on a meta block-by-meta block basis. The one or more metrics tracked by the metric tracker 170 may include a program/erase (P/E) count (PEC) 172, a failed bit count (FBC) 174, and a trim value 176 (e.g., a trim index value), as illustrative, non-limiting examples. Alternatively, or in addition, the one or more metrics tracked by metric tracker 170 include a bit error rate (BER), a programming time, an erase time, a number of voltage pulses to program a storage element, a number of voltage pulses to erase a storage element, one or more other metrics corresponding to the memory 104, or a combination thereof, as illustrative, non-limiting examples.

The P/E count 172 may be associated with a number of program/erase cycles, such as a number of program/erase cycles performed at a storage element, a page, a wordline, a block, a die, a meta-plane, and/or a memory system. The FBC 174 may be associated with a number of failed bits that occur based on a write operation. For example, data may be received and stored in one or more latches, the data may be written from the one or more data latches to a region (e.g., a wordline) of the memory 104 as part of a write operation and, after the write operation is completed (e.g., immediately following the write operation), a number of failed bits (e.g., erroneous bit values) stored at the region may be determined by reading data values stored in the region (e.g., the wordline) and by comparing the data values to the data in the one or more latches.

The trim value 176 may be associated with one or more operating parameters of the memory 104, such as a number of erase pulses, a number of write pulses, a read voltage threshold, etc., as illustrative, non-limiting examples. The one or more operating parameters associated with the trim value 176 may be adjusted during an operational life of the data storage device 102 to "fine tune" use of one or more storage elements, such as an amount of charge that is maintained at a particular storage element. The trim value 176 may correspond to an index that indicates a relative amount of change in the one or more operating parameters. For example, a trim index may include values 0-9, where an index value of 0 corresponds to initial operating parameters of the memory 104 and an index value of 9 corresponds to operating parameters with significant change from the initial operating parameters. In some implementations, each trim index value may correspond to a different set of one or more operating parameters, such as a set of operating parameters that includes a number of erase pulses, a number of write pulses, a read voltage threshold, etc.

The health meter 184 may be configured to determine a life stage associated with the memory 104, such as a life stage corresponding to a storage element, a page, a wordline, a block, a die, a meta block, and/or the memory 104 (e.g., a memory system). For example, the health meter 184 may determine (e.g., identify) a particular life stage from multiple life stages, such as a first life stage and a second life stage. In some implementations, the multiple life stages may include more than two life stages. The health meter 184 may determine the life stage based on the P/E count 172, an amount of data received from the host device 150, an amount of data written to the memory 104 (or a portion thereof), or a combination thereof, as illustrative, non-limiting examples. Additionally, the health meter 184 may be configured to determine (e.g., detect) a transition from one life stage to a next life stage, such as a first transition from the first life stage to the second life stage. For example, the health meter 184 may determine (e.g., identify) the first transition from the first life stage to the second life stage based on a number of P/E cycles being greater than or equal to a first transition threshold number of P/E cycles. As another example, the health meter 184 may determine (e.g., identify) a second transition from the second life stage to a third life stage based on a second number of P/E cycles being greater than or equal to a second transition threshold number of P/E cycles. In other examples, the health meter 184 may determine (e.g., detect) the second transition from the second life stage to the third life stage based on an amount of data written to the memory 104 being greater than or equal to a threshold amount of data written.

The health meter 184 may also be configured to select one of the health schemes 178 based on the determined life stage for use as the health scheme 185, as described herein. Each of the health schemes 178 may be applied to generate a health indicator (e.g., to quantify a health of a portion (e.g., a region) of the memory 104, such as a storage element, a page, a wordline, a block, a die, a meta block, or the memory 104 as a whole). For example, each of the health schemes 178 may define one or more metrics to be used to generate a health indicator and/or one or more weight values to be applied to the one or more metrics, as described further herein. The health schemes 178 may include multiple health schemes, such as a first health scheme 180 and a second health scheme 182. Each of the health schemes 178 may include or correspond to a life stage of the multiple life stages and may be used to generate one or more health indicators. In some implementations, the health schemes 178 may include multiple health schemes that correspond to a particular life stage. Each of the multiple health schemes that correspond to the particular life stage may be used to determine one or more health indicators associated with a different category of the memory 104 (e.g., a storage element category, a page category, a wordline category, a block category, a die category, etc.). As an example, one health scheme may be used to determine one or more block health indicators and another health scheme may be used to determine one or more die health indicators.

As an illustrative example, the health meter 184 may determine that the memory 104 is associated with a first life stage of the multiple life stages. For example, the health meter 184 may compare the P/E count 172 of the memory 104 to a threshold value (e.g., a threshold number of P/E cycles) and, based on the P/E count 172 being less than the threshold value, the health meter 184 may determine that the memory 104 is in the first life stage. Based on the memory 104 being in the first life stage, the health meter 184 may select the first health scheme 180 to be used as the health scheme 185. The health meter 184 may apply the health scheme 185 (e.g., the first health scheme 180) using a first set of one or metrics (maintained by the metric tracker 170) to generate health indicators for each of the blocks 142-146. The one or more metrics applied for a particular block may correspond to the particular block (e.g., a P/E count of the block 142 may be used to determine a health indictor of the block 142 and a P/E count of the block 144 may be used to determine a health indicator of the block 144). As another example, based on the P/E count 172 being greater than or equal to the threshold value, the health meter 184 may determine that the memory 104 is in the second life stage of the multiple life stages. Based on the memory 104 being in the second life stage, the health meter 184 may select the second health scheme 182 to be used as the health scheme 185. The health meter 184 may apply the health scheme 185 (e.g., the second health scheme 182) to a second set of one or metrics to generate health indicators of each of the blocks 142-146. The first set of one or more metrics may be the same as or different than the second set of one or more metrics. When the first set of one or more metrics is the same as the second set of one or more metrics, different weight value may be applied to the first set of one or more metrics and to the second set of one or more metrics. The health meter 184 may provide an output 186 that includes the health indicators (e.g., health status information) associated with the memory 104, such as the health indicators of one or more storage elements, one or more pages, one or more wordlines, one or more blocks, one or more dies, one or more meta blocks, or an entirety of the memory 104.

The output 186 including one or more health indicators (e.g., the health status information) may be received by the selector 188. In other implementations, the output 186 may be provided to a particular memory associated with the controller 120, such as a random access memory (RAM) included in or coupled to the controller 120. For example, the particular memory may include a table that is configured to track a corresponding health indicator for each region of a plurality of regions of the memory 104. The selector 188 may access the health status information from the particular memory (e.g., from the table).

The selector 188 may be configured to select a location (e.g., a storage element, a page, a wordline, a block, a die, and/or meta block) of the memory 104 to be subject to a memory operation, such as a write operation, a wear leveling operation, a garbage collection operation, a background scanning operation, etc., as illustrative, non-limiting examples. For example, the selector 188 may select the location based on the health status information generated by the health meter 184. To illustrate, in response to a request to perform a memory operation, the selector may identify one or more regions of the memory 104 available for a write operation (e.g., one or more regions available to have data written thereto). For example, the controller 120 may maintain a list of free blocks of the memory 104 that may be used to perform the memory operation. The selector 188 may identify one or more health indicators, where each of the one or more health indicators corresponds to an available region of the one or more regions. The selector 188 may identify a particular health indicator of the one or more health indicators that is greater than a threshold value or the selector 188 may identify a particular health indicator of the one or more health indicators that indicates a healthiest region. The selector 188 may select a region corresponding to the particular health indicator to be subject to the memory operation.

When the memory 104 is in the first life stage, the selector 188 may select (e.g., identify) a first region (e.g., a first memory address) based on health status information generated using the first health scheme 180 and the controller 120 may send a first life stage memory operation 162 to be executed with reference to the first region. When the memory 104 is in the second life stage, the selector 188 may select (e.g., identify) a second region based on health status information generated using the second health scheme 182 and the controller 120 may send a second life stage memory operation 164 to be executed with reference to the second region (e.g., a second memory address).

During operation of the data storage device 102, the controller 120 may be configured to identify a life stage of multiple life stages of the data storage device 102. For example, the health meter 184 may identify a particular life stage associated with the memory 104. Based on the identified life stage, the health meter 184 may select a set of weight values of multiple sets of weight values. To illustrate, based on the life being identified as a first life stage, the health meter 184 may select a first set of weight values to be used with the health scheme 185. Alternatively, based on the life stage being identified as a second life stage, the health meter 184 may select a second set of weight values to be used with the health scheme 185. Examples of sets of weight values are described with reference to FIGS. 3-4. In some implementations, the health meter 184 may select one of the health schemes 178 to be used as the health scheme 185 based on the identified life stage. For example, during the first life stage, the health meter 184 may use the first health scheme 180 as the health scheme 185 and during the second life stage the health meter 184 may use the second health scheme 182 as the health scheme 185.

When the memory 104 is operating within the identified life stage, the health meter 184 may apply the health scheme 185 having the selected set of weight values to determine one or more health indicators. For example, the health meter 184 may determine a health indicator for one or more storage elements, one or more pages, one or more wordlines, one or more blocks, one or more dies, one or more meta blocks, or a combination thereof. Based on the one or more health indicators determined by the health meter 184, the selector 188 may identify a region of the memory 104 at which a memory operation may be performed during the identified life stage.

Although the data storage device 102 has been described with reference to FIG. 1 as including two life stages, in other implementations the data storage device 102 (e.g., the memory 104) may be associated with more than two life stages. For example, the health meter 184 may determine whether the memory 104 is associated with one of three or more distinct life stages, such as a first stage, a second stage, and a third stage. The second stage may occur after the first stage, and the third stage may occur after the second stage.

As an illustrative example, the controller 120 may be configured to track one or more metrics associated with the memory 104. For example, the metric tracker 170 may track the one or more metrics. The controller 120 may further be configured to determine, based on the one or more metrics, a transition from a first life stage of the memory 104 to a second life stage of the memory 104. Based on the transition to the second life stage, the controller 120 may modify weight values associated with the health scheme 185. The controller 120 (e.g., the health meter 184) may use the modified weight values to determine a health indicator of multiple regions (e.g., multiple blocks 142-146) included in the memory 104. The controller 120 may be configured to select one or more regions (e.g., one or more blocks of the multiple blocks 142-146) during the second life stage based on the health indicators.

As another illustrative example of the data storage device 102 that includes three life stages, the health scheme 185 may be associated with an equation (e.g., a formula) that uses weight values that depend on a life stage associated with the memory 104. The equation may use one or more metrics, such as the FBC (Failed Bit Count) 174 and the PEC (Program/Erase Count) 172, to evaluate a block health meter (BHM) (e.g., an equation) that is used to generate one or more health indicator values. To illustrate, the BHM may be:

$$\text{BHM(Block Health Meter)} = a*\text{FBC} + b*\text{PEC},$$

where a and b represent the weights applied to the FBC (Failed Bit Count) 174 and the PEC (Program/Erase Count) 172, respectively. As described herein, the health meter 184 may apply the BHM to determine health indicators corresponding to blocks of the memory 104.

Based on a determination by the health meter 184 that the memory 104 is associated with the first life stage, the health meter 184 may use a first set of weight values that includes weight values (a, b)=(0.2, 0.8). Accordingly, the BHM for the first life stage is:

$$\text{BHM}_{First\_Stage} = 0.2*\text{FBC} + 0.8*\text{PEC}.$$

The BHM for the first life stage may include or correspond to the health scheme 185 applied during the first life stage of the memory 104, such as the first health scheme 180. Since the program/erase count metric has more weight than the FBC metric, the data storage device 102 may favor uses of blocks having a lower PEC, thus promoting regular use of each of the blocks.

Based on a determination by the health meter 184 that the memory 104 is associated with the second life stage, the health meter 184 may use a second set of weight values that includes weight values (a, b)=(0.6, 0.4). Accordingly, the BHM for the second life stage is:

$$\text{BHM}_{Second\_Stage} = 0.6*\text{FBC} + 0.4*\text{PEC}.$$

The BHM for the second life stage may include or correspond to the health scheme 185 applied during the second life stage of the memory 104, such as the second health scheme 182. With increased weight on the FBC, the blocks having lower error rates may be favored for use, thus encouraging use of healthy blocks over unhealthy blocks (e.g., blocks having higher error rates).

Based on a determination by the health meter 184 that the memory 104 is associated with the third life stage, the health meter 184 may use a third set of weight values that includes weight values (a, b)=(1.0, 0.0). That is the BHM for the second stage is:

$$\text{BHM}_{Third\_Stage} = \text{FBC}.$$

The BHM for the third life stage may include or correspond to the health scheme 185 applied during the third life stage of the memory 104, such as a third life scheme (not shown) of the health schemes 178. Thus, when the memory 104 is approaching an end-of-life condition (e.g., a low endurance condition where a memory failure is likely), the data storage device 102 may focus purely on the FBC 174 to push the blocks to their operational limit (e.g., a limit associated with a particular block having a number of errors that is greater than a correction capability of the data storage device 102, such as an error correction capability of an error correction code (ECC) engine associated with the data storage device 102). As seen with the above example, a weight value associated with the PEC 172 may decrease over time and a weight value associated with FBC 174 may increase over time.

As another example, the health scheme 185 associated with the data storage device 102 may be associated with an equation (e.g., a BHM) that accounts for adaptive trimming to evaluate a health of the memory 104. The BHM may use one or more metrics, such as a combination of the FBC 174, the PEC 172, and/or the Trim 176, as illustrative, non-limiting examples. To illustrate, the BHM may be:

$$BHM = a*FBC + b*PEC + c*Trim,$$

where a, b, and c represent the weights applied to the FBC (Failed Bit Count) 174, the PEC (Program/Erase Count) 172, and the trim index value 176, respectively. As seen with the BHM that accounts for adaptive trimming, a weight value associated with the PEC 172 decreases over time and a weight value associated with the FBC 174 increases over time. Additionally, a weight value associated with the trim index value 176 may decrease over time, as further illustrated with reference to FIG. 4.

As provided in the above example, the BHMs (e.g., the health schemes), the number of life stages, and the weight values corresponding to each life stage are for presented illustration purposes only and should not be considered limiting in any way. In other implementations, other BHMs (e.g., the health schemes), number of life stage, and/or weight values may be used. Additionally, although the BHMs (e.g., the health schemes) are described as adding weighted metric values, in other implementations a particular BHM may perform a different mathematical operation using the weighted metric values to determine a value associated with a health indicator. As an illustrative, non-limiting example, the particular BHM may multiply a weighted FBC value and a weighted PEC value to generate a BHM value associated with (or to define) a health indicator.

In some implementations, the one or more metrics tracked by the metric tracker 170, the health schemes 178 (e.g., the sets of weight values), the output 186 (e.g., one or more health indicators), or a combination thereof, may be stored at the memory 104. In other implementations, the controller 120 may include or be coupled to a particular memory (not shown), such as a random access memory (RAM), that is configured to store the one or more metrics tracked by the metric tracker 170, the health schemes 178 (e.g., the sets of weight values), the output 186 (e.g., one or more health indicators), or a combination thereof. Alternatively, or in addition, the particular memory included in or coupled to the controller 120 may include another type of memory, such as a non-volatile memory. The particular memory may be a single memory component, may include multiple distinct memory components, and/or may indicate multiple different types (e.g., volatile memory and/or non-volatile) of memory components. In some embodiments, the particular memory may be included in the host device 150.

In some implementations, the data storage device 102 may include an error correction code (ECC) engine. The ECC engine may be configured to receive data, such as the user data 132, and to generate one or more error correction code (ECC) codewords (e.g., including a data portion and a parity portion) based on the data. For example, the ECC engine may receive the user data 132 and may generate a codeword. To illustrate, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine may include a decoder configured to decode data read from the memory 104 to detect and correct bit errors that may be present in the data. For example, the ECC engine may correct a number of bit errors up to an error correction capability of an ECC technique used by the ECC engine. A number of errors identified by the ECC engine may be tracked by the controller 120, such as by the ECC engine. For example, based on the number of errors, the ECC engine may determine a bit error rate (BER) associated with the memory 104.

Although one or more components of the data storage device 102 have been described with respect to the controller 120, in other implementations certain components may be included in the memory 104. For example, one or more of the metric tracker 170, the health schemes 178, the health meter 184, and the selector 188 may be included in the memory 104. Alternatively, or in addition, one or more functions as described above with reference to the controller 120 may be performed at or by the memory 104. For example, one or more functions of the metric tracker 170, the health schemes 178, the health meter 184, and/or the selector 188 may be performed by components and/or circuitry included in the memory 104. Alternatively, or in addition, one or more components of the data storage device 102 may be included in the host device 150. For example, one or more of the metric tracker 170, the health schemes 178, the health meter 184, and/or the selector 188 may be included in the host device 150, such as described with reference to FIG. 2. Alternatively, or in addition, one or more functions as described above with reference to the controller 120 may be performed at or by the host device 150.

FIG. 1 therefore illustrates example operations and structures that may adaptively generate one or more health indicators associated with the memory 104. For example, by determining a life stage associated with the memory 104, the controller 120 may select and/or change a health scheme (e.g., one or more weight values) applied and, thus, may dynamically determine the one or more health indicators based on changing operating conditions associated with the data storage device 102. Additionally, each health scheme (and/or set of weight values) may be configured to address memory usage priorities based on the life stage. Accordingly, each health scheme may optimize use of the memory 104 during the life stage to promote reduced power consumption, shortened program and erase times, increased data retention, increased reliability, and/or increased operating life of the memory 104.

Figure 2:
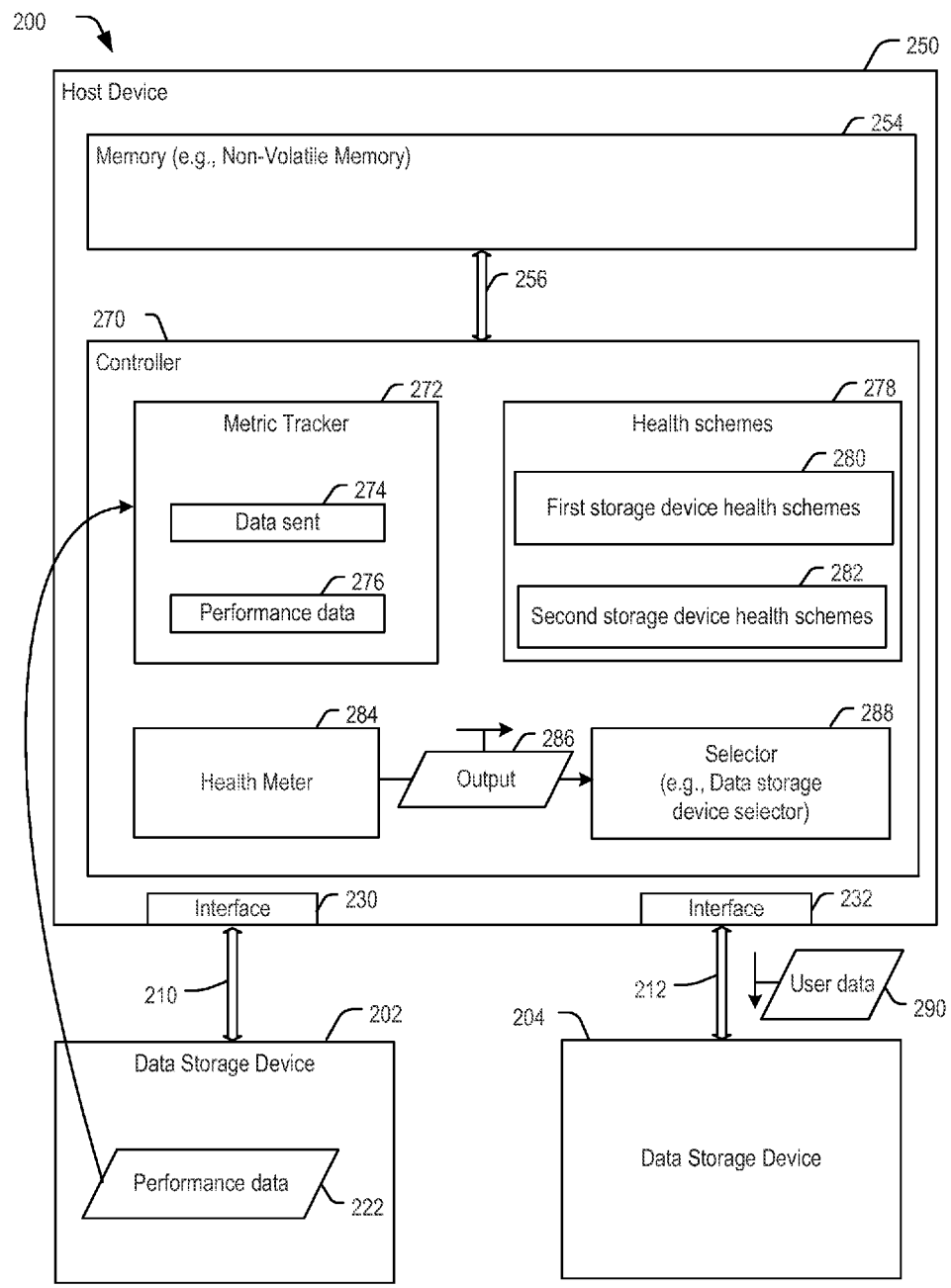
FIG. 2 is a block diagram of a particular illustrative embodiment of a system including a host device configured to determine a health associated with one or more data storage devices.

Referring to FIG. 2, a particular illustrative embodiment of a system is depicted and generally designated 200. The system 200 includes data storage devices 202, 204 and a host device 250. Each of the data storage devices 202, 204 may include or correspond to the data storage device 102 of FIG. 1. The host device 250 may include or correspond to the host device 150 of FIG. 1.

The host device 250 may be configured to be coupled one or more data storage devices, such as the data storage devices 202, 204. For example, the host device 250 may be coupled to the data storage device 202 via a communication path 210, such as a wired communication path and/or wireless communication path. As another example, the host device 250 may be coupled to the data storage device 204 via a communication path 212, such as a wired communication path and/or a wireless communication path. The communication path 210 and/or the communication path 212 may include or correspond to the communication path 110 of FIG. 1. The host device 250 may include one or interfaces, such as interfaces 230, 232 that enable communication via the communications paths 210, 212 between the host device 250 and the data storage devices 202, 204, such as when the interface 230 is communicatively coupled to the data storage device 202 and/or when the interface 232 is communicatively coupled to the data storage device 204. Although the host device 250 is illustrated as being coupled to two data storage devices, in other implementations the host device 250 may be coupled to less than two data storage devices or more than two data storage devices. The data storage devices 202, 204 may be embedded within the host device 250 and/or removable from the host device 250 (i.e., "removably" coupled to the host device 250).

The host device 250 may be configured to determine (and/or detect) one or more health indicators (e.g., one or more health indicators) associated with the data storage devices 202, 204. The one or more health indicators may be associated with or correspond to one or more health indicators of storage elements, pages, wordlines, blocks, dies, meta blocks, and/or memory systems of the data storage devices 202, 204. The host device 250 may determine one or more first health indicators associated with a memory of the data storage device 202 and/or may determine one or more second health indicators associated with a memory of the data storage device 204. For example, the one or more first health indicators may be determined based on a life stage of the memory of the data storage device 202 and the one or more second health indicators may be determined based on a life stage of the memory of the data storage device 204. Based on the one or more first health indicators and/or the one or more second health indicators, the host device 250 may select between the data storage device 202 or the data storage device 204 to receive data for storage. For example, the host device 250 may direct a write command to the data storage device 202 or the data storage device 204 based on their respective health.

The host device 250 may include a controller 270 (e.g., a processor) and a memory 254, such as a non-volatile memory, that is coupled to the controller 270. For example, the controller 270 may be coupled to the memory 254 via a bus 256, an interface (e.g., interface circuitry), another structure, or a combination thereof. For example, the bus 256 may include multiple distinct channels to enable the controller 270 to communicate with the memory 254. The memory 254 may be configured to store data and/or instructions that may be executable by the controller 270. The memory 254 may be a single memory or may include one or more memories, such as one or more non-volatile memories, one or more volatile memories, or a combination thereof. In some implementations, the data and/or the instructions that may be executable by the controller 270 may be stored in one or more of the data storage devices 202, 204. The host device 250 may be configured to issue one or more commands to the data storage devices 202, 204, such as one or more requests to erase, read data from, or write data to a memory of the data storage device 202 and/or a memory of the data storage device 204. For example, the host device 250 may be configured to issue a write command associated with user data 290 to be stored at the data storage device 204.

The controller 270 may be configured to determine one or more health indicators (e.g., one or more health statuses) associated with the data storage devices 202, 204. The controller 270 may include a metric tracker 272, health schemes 278, a health meter 284, and a selector 288. The metric tracker 272 may be configured to track one or more first metrics associated with the data storage device 202 (e.g., a memory of the data storage device 202) and/or one or more second metrics associated with the data storage device 204 (e.g., a memory of the data storage device 204). The one or more first metrics may include the same metrics as, and/or different metrics than, the one or more second metrics.

The metric tracker 272 may be configured to track data sent 274 and performance data 276. The data sent 274 may include or correspond to an amount of data sent for storage to the data storage device 202 and/or to the data storage device 204. The amount of data sent for storage to a particular data storage device may be less than a total amount of data that has been written in the particular data storage device due to "write amplification". To illustrate, the particular data storage device may receive first data to be stored and may write the first data to a first location of a particular memory. During operation, the particular data storage device may perform garbage collection, wear leveling, or one or more other procedures that cause the first data to be copied from the first location and written to a second location of the particular memory. Thus, the particular data storage device may receive the first data for storage and may write the same data at least twice, and potentially many more times, to different memory locations over the life of the particular data storage device.

The performance data 276 may include one or more metrics and/or data that is associated with the data storage device 202 and/or the data storage device 204. For example, the performance data 276 may include data associated the data storage device 202, such as data associated with a memory of the data storage device 202. The performance data 276 may be on a storage element-by-storage element basis, on a page-by-page basis, on a wordline-by-wordline basis, on a block-by-block basis, on a die-by-die basis, and/or on a meta block-by-meta block basis. To illustrate, the performance data may include a program/erase (P/E) count (PEC), a failed bit count (FBC), and a trim value (e.g., a trim index value), a bit error rate (BER), a programming time, an erase time, a number of voltage pulses to program a storage element, a number of voltage pulses to erase a storage element, an amount of data received by the data storage device 202, an amount of data written to the memory of the data storage device 202, a life stage indicator (indicating a life stage associated with the memory of the data storage device 202), one or more health indicators associated with the memory of the data storage device 202, or a combination thereof, as illustrative, non-limiting examples.

The host device 250 may receive data from the data storage device 202 and/or the data storage device 204 to populate the performance data 276. For example, the host device 250 may receive data (e.g., performance data 222)

from the data storage device 202 that the host device 250 uses to populate the performance data 276. In some embodiments, the performance data 222 received from the data storage device 202 may include or correspond to information tracked by the metric tracker 170 and/or the output 186 of the health meter 184 of FIG. 1. The host device 250 may periodically (automatically) receive performance information or other data from the data storage devices 202, 204 and/or the host device 250 may receive the data responsive to a request for the data sent by the host device 250 to the data storage device 202 or to the data storage device 204.

The health meter 284 may be configured to determine a life stage associated with a memory of data storage device 202 and/or a memory of the data storage device 204. For example, the health meter 284 may determine (e.g., identify) a particular life stage associated with the data storage device 202 from a first set of multiple life stages corresponding to the data storage device 202. The health meter 284 may determine the particular life stage based on one or more metrics tracked by the metric tracker 272 (e.g., the data sent 274 and/or the performance data 276). For example, the health meter 284 may determine the particular life stage based on the data sent 274 (e.g., an amount of data sent to the data storage device 202), a number of program/erase cycles, a failed bit count, an amount of data written (e.g., to a memory of the data storage device 202), or a combination thereof, as illustrative, non-limiting examples. In some implementations, the performance data 276 may indicate the particular life stage of the data storage device 202 based on an indication (e.g., a health indicator) included in the performance data 222 and the health meter 284 may detect the particular life stage as indicated by the performance data 276.

The health meter 284 may be configured to determine a transition from one life stage to a next life stage, such as a first transition from a first life stage of the data storage device 202 to a second life stage. For example, the health meter 284 may detect the transition based on the data sent 274, a number of program/erase cycles, a failed bit count, an amount of data written (e.g., to a memory of the data storage device 202), or a combination thereof, as illustrative, non-limiting examples.

The health meter 284 may also be configured to select one of the health schemes 278 based on a determined life stage, as described herein. The health schemes 278 may include first storage device health schemes 280 and second storage device health schemes 282. The first storage device health schemes 280 may include a first set of multiple health schemes and may be associated with a first type of data storage device. The second storage device health schemes 282 may include a second set of multiple health schemes and may be associated with a second type of data storage device. For example, the data storage device 202 may have universal serial bus (USB) type that corresponds to the first storage device health schemes 280 and the data storage device 204 may have a secure digital (SD) type that corresponds to the second storage device health schemes 282. The health meter 284 may be able to select (e.g., access) one or more schemes of the health schemes 278 based on a device type of the data storage devices 202, 204. Alternatively, or in addition, the health meter 284 may be configured to select one of the health schemes 278 based on a storage capacity of a particular data storage device. For example, the first storage device health schemes 280 may be associated with or correspond to a first storage capacity and the second storage device health schemes 282 may be associated with or correspond to a second storage capacity. The host device 250 may receive an indication from a particular data storage device that indicates a device type and/or a storage capacity of the particular data storage device, such as an indication received during a pairing process (e.g., an association process) between the host device 250 and the particular data storage device or a start-up process (e.g., a power-on operation) of the host device 250 that is communicatively coupled to the particular data storage device.

Each scheme of the health schemes 278 may include or correspond to a life stage of multiple life stages and may be used to generate one or more health indicators. For example, the first storage device health schemes 280 may include the health schemes 178 of FIG. 1 for the data storage device 202, and the second storage device health schemes 282 may include the health schemes 178 of FIG. 1 for the data storage device 204.

The health meter 284 may generate one or more health indicators that are included in an output 286 that is provided to the selector 288. Alternatively, or in addition, the output 286 may be provided to a memory, such as the memory 254, a memory of the controller 270 (e.g., a random access memory (RAM) included in or coupled to the controller 270), a memory of the data storage device 202, and/or a memory of the data storage device 204, as illustrative, non-limiting examples.

The selector 288 may be configured to select a particular data storage device of the data storage devices 202, 204 to receive data from the host device 250. In some implementations, the selector 288 may be configured to select a region (e.g., a storage element, a page, a wordline, a block, and/or a die) of a memory of the particular data storage device to store the data. For example, the selector 288 may compare a first health indicator of the data storage device 202 to a second health indicator of the data storage device 204 and the selector 288 may select the data storage device corresponding that is healthier based on the first health indicator and the second health indicator. As another example, the selector 288 may determine a first set of health indicators for available (e.g., free) regions of the data storage device 202 and may determine a second set of health indicators for available (e.g., free) regions of the data storage device 204. The selector 288 selects a particular region of the available regions of the data storage devices 202, 204 based on the first set of health indicators and/or the second set of health indicators. In some implementations, a healthiest region may be determined based on a comparison between one or more of the first set of health indicators and/or one or more of the second set of health indicators to identify the healthiest region. In other implementations, a healthiest region may be selected as a region corresponding to a health indicator of the first set of health indicators or the second set of health indicators that is greater than or equal to a threshold value.

During operation of the host device 250, the controller 270 may identify a life stage of the data storage device 202 and may identify a life stage of the data storage device 204. For example, the health meter 284 may identify and/or detect two life stages—a first life stage for the data storage device 202 and a second life stage for the data storage device 204—based on information (e.g., data) maintained by the metric tracker 272.

The health meter 284 may determine a first health indicator associated with a first memory of the first data storage device based on the first life stage and may determine a second health indicator associated with a second memory of the second data storage device based on the second life stage. For example, the health meter 284 may determine the first health indicator corresponding to a first region of the first memory and may determine the second health indicator corresponding to a second region of the second memory. As another example, the health meter 284 may determine the first health indicator corresponding to an entirety of the first memory and may determine the second health indicator corresponding to an entirety of the second memory.

Based on the first health indicator and the second health indicator, the controller 270 may send data to the first data storage device or to the second data storage device for storage. To illustrate, the first health indicator may correspond to a health of an entirety of the first memory which is in a fourth life stage (e.g., a final life stage) of a total of four life stages and the second health indicator may correspond to a health of an entirety of the second memory which is in a first life stage (e.g., a beginning life stage) of a total of five life stages. In some implementations, a value of the first health indicator and a value of the second health indicator may be scaled (e.g., mapped to a value included in a range, such as a range of 0-9 inclusive) to enable the host device 250 to compare the first and second health indicators. Based on the first health indicator and the second health indicator, the selector 288 may select the second data storage device (e.g., the data storage device 204) to receive the user data 290.

In some implementations, the host device 250 may be programmed with the health schemes 278 prior to being coupled to the data storage devices 202, 204. Alternatively, or in addition, the host device 250 may receive one or more schemes of the health schemes 278 from a data storage device 202, 204 when the host device 250 is coupled to the data storage device 202, 204. Similarly, the host device 250 may be programmed to recognize a number of life stages of a data storage device 202, 204 prior to being coupled to the data storage device 202, 204 or the host device 250 may receive information regarding recognition of the number of life stages from the data storage device 202, 204. For example, when the host device 250 includes the health schemes 278 (e.g., the first storage device health schemes 280 and the second storage device health schemes 282), the host device 250 may select a particular health scheme based on a device type, a memory storage capacity, and/or a memory type of a data storage device 202, 204. In some implementations, the host device 250 may receive an indication of the number of life stages of a data storage device 202, 204 and may select a particular health scheme of the first storage device health schemes 280 or the second storage device health schemes 282 based on the indication.

In some implementations, the one or more metrics tracked by the metric tracker 272, the health schemes 278 (e.g. the sets of weight values), the output 286 (e.g., one or more health indicators), or a combination thereof, may be stored at the memory 254 or at another memory (not shown), such as a random access memory (RAM) or a non-volatile memory, that is configured to store the one or more metrics tracked by the metric tracker 272, the health schemes 278 (e.g. weight values), the output 286 (e.g., one or more health indicators), or a combination thereof. Such memory may be a single memory component, may include multiple distinct memory components, and/or multiple different types (e.g., volatile memory and/or non-volatile) of memory components. In some implementations, one or more of the metrics of the metric tracker 272, the output 286, or the health schemes 278 may be stored in one or more of the data storage devices 202, 204.

Although one or more components of the host device 250 have been described with respect to the controller 270, in other implementations certain components may be included in one of the data storage devices 202, 204. For example, one or more of the metric tracker 272, the health schemes 278, the health meter 284, and/or the selector 288 may be included in one of the data storage devices 202, 204. In some implementations, one or more functions as described above with reference to the controller 270 (e.g., the host device 250) may be performed at or by one of the data storage devices 202, 204.

FIG. 2 therefore illustrates example operations and structures that may adaptively generate one or more health indicators associated with the data storage devices 202, 204. For example, by determining a life stage associated with each of the data storage devices 202, 204, the host device 250 may determine which data storage device to route data to. Accordingly, the host device 250 may route data to a particular data storage device having a greater endurance and/or reliability.

Figure 3:
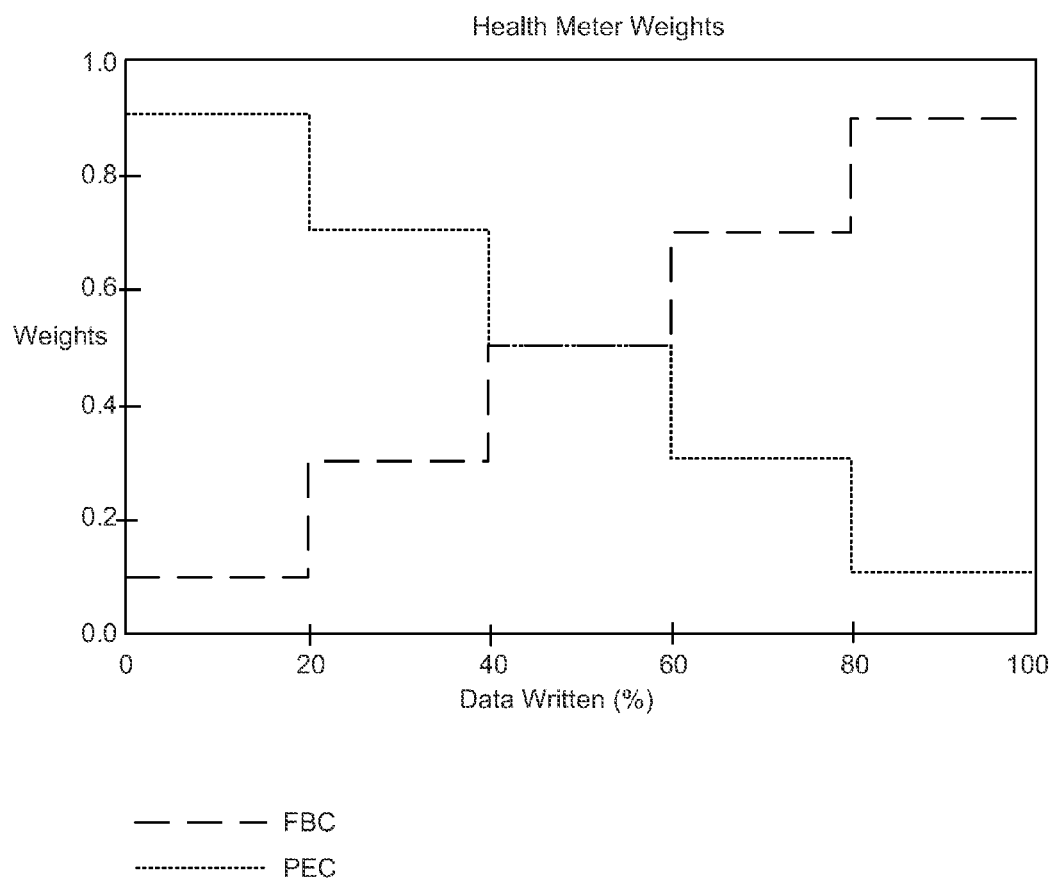
FIG. 3 is a first graph that illustrates a first embodiment of different weight values applied during operation of a data storage device.

Referring to FIG. 3, a first graph 300 illustrates an example of different weight values applied during operation of a data storage device. For example, the data storage device may include or correspond to the data storage device 102 of FIG. 1, the data storage device 202, or the data storage device 204 of FIG. 2.

The horizontal axis (e.g., the x axis) shows data written to a memory, such as the memory 104 of FIG. 1, as a percentage of a total amount of data that the data storage device is able to write, and may be based on a projected (e.g., predicted) capability and/or endurance of the data storage device. The data storage device may be associated with five life stages, such as a first life stage, a second life stage, a third life stage, a fourth life stage, and a fifth life stage. Each life stage may correspond to a range of data written. For example, the data storage device may be in the first life stage and transition to the second life stage when a percentage of data written equals 20%. The data storage device may transition to the third life stage when the percentage of data written equals 40%, to the fourth life stage when the percentage of data written equals 60%, and to the fifth life stage when the percentage of data written equals 80%.

The vertical axis (e.g., the y axis) shows weight values that may be applied to one or more metrics associated with the data storage device, such as one or more metrics applied to a health scheme during a corresponding life stage. The one or more metrics may be used to determine a health indicator associated with a memory of the data storage device. For example, the one or more metrics may be associated with or correspond to a failed bit count (FBC) and to a program/erase (P/E) count (PEC). To illustrate, the weight values for a particular life stage may be used by a health meter, such as the health meter 184 of FIG. 1, to determine one or more health indicators associated with the memory. The FBC and the PEC may include or correspond to the failed bit count 174 and the P/E count 172 of FIG. 1, respectively.

The graph 300 illustrates that, during the first life stage, a weight value associated with the FBC is 0.1 and a weight value associated with the PEC is 0.9. During the second life stage, a weight value associated with the FBC is 0.3 and a weight value associated with the PEC is 0.7. During the third life stage, a weight value associated with the FBC is 0.5 and a weight value associated with the PEC is 0.5. During the fourth life stage, a weight value associated with the FBC is 0.7 and a weight value associated with the PEC is 0.3. During the fifth life stage, a weight value associated with the FBC is 0.9 and a weight value associated with the PEC is 0.1. Thus, as illustrated by the graph 300, a weight value associated with the PEC may decrease over time (as a percentage of data written increases) and a weight value associated with the FBC may increase over time (as a percentage of data written increases).

Figure 4:
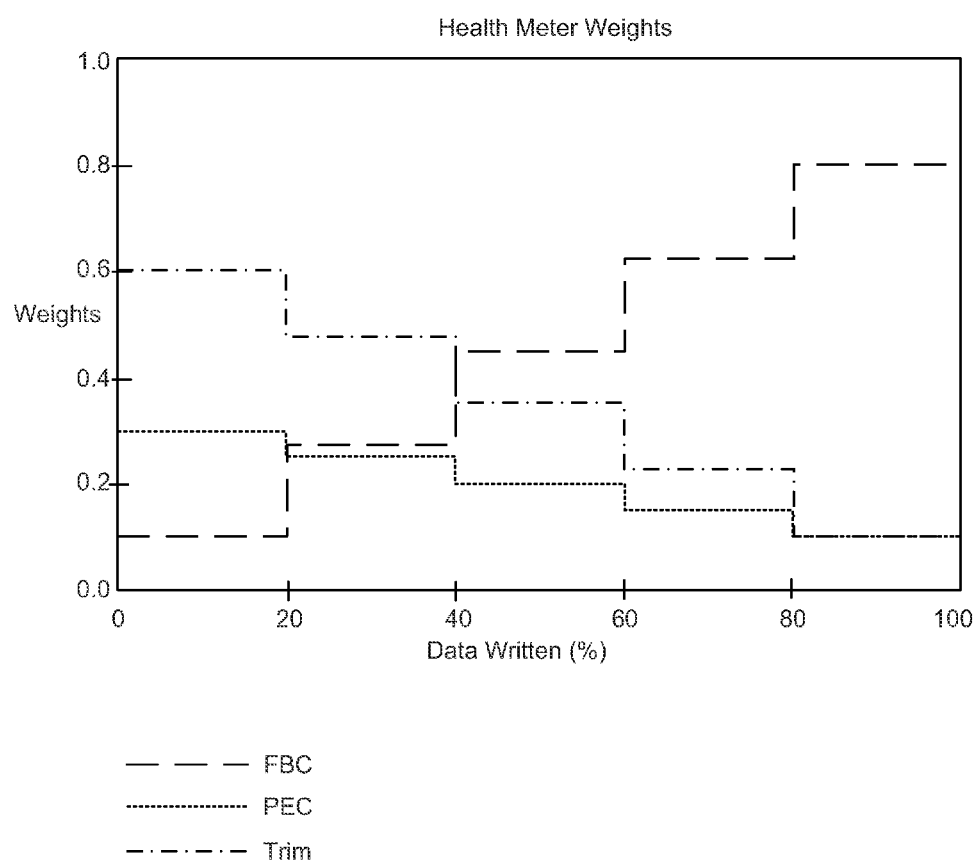
FIG. 4 is a second graph that illustrates a second embodiment of different weight values applied during operation of a data storage device.

Referring to FIG. 4, a second graph 400 illustrates another example of different weight values applied during operation of a data storage device. For example, the data storage device may include or correspond to the data storage device 102 of FIG. 1, the data storage device 202, or the data storage device 204 of FIG. 2.

The horizontal axis (e.g., the x axis) and the vertical axis (e.g., the y axis) of the graph 400 may include or correspond to the horizontal axis (e.g., the x axis) and the vertical axis (e.g., the y axis) of the graph 300. Additionally, the data storage device corresponding to the graph 400 may be associated with or include five life stages as described above with reference to the graph 300 of FIG. 3.

The metrics illustrated in the graph 400 may be associated with or correspond to a failed bit count (FBC), to a program/erase (P/E) count (PEC), and to a trim value. The FBC, the PEC, and the trim value may include or correspond to the failed bit count 174, the P/E count 172, and the trim value 176 of FIG. 1, respectively.

The graph 400 illustrates that, during the first life stage, a weight value associated with the FBC is 0.1, a weight value associated with the PEC is 0.3, and a weight value associated with the trim value is 0.6. During the second life stage, a weight value associated with the FBC is 0.26, a weight value associated with the PEC is 0.24, and a weight value associated with the trim value is 0.5. During the third life stage, a weight value associated with the FBC is 0.46, a weight value associated with the PEC is 0.2, and a weight value associated with the trim value is 0.34. During the fourth life stage, a weight value associated with the FBC is 0.62, a weight value associated with the PEC is 0.16, and a weight value associated with the trim value is 0.22. During the fifth life stage, a weight value associated with the FBC is 0.8, a weight value associated with the PEC is 0.1, and a weight value associated with the trim value is 0.1. Thus, as illustrated by the graph 400, a weight value associated with the PEC may decrease over time (as a percentage of data written increases) and a weight value associated with the FBC may increase over time (as a percentage of data written increases). Additionally, a weight value associated with the trim value may decrease over time (as a percentage of data written increases).

Although the life stages of the graphs 300, 400 have been described as being based on ranges associated with a percentage of data written to a memory of the data storage device, in some implementations one or more life stages may be based on a number or a range of program/erase counts and/or an amount of data received by the data storage device. For example, a particular data storage device may be in the first life stage when the number of program/erase cycles is less than a threshold number of program/erase cycles. Based on the number of program erase cycles being equal to the threshold number of program erase cycles, the particular data storage device may transition to the second life stage. The particular data storage device may remain in the second life stage until an amount of data written is greater than or equal to a threshold percentage of data written (e.g., forty percent).

Although the graphs 300, 400 have been illustrated to depict data storage devices associated with five life stages, in other implementations the data storage devices may be associated with two, three, four, or more than five life stages. Additionally, the weight values provided in relation to the graphs 300, 400 are presented for illustrative purposes, in other implementations other weight values may be used.

Figure 5:
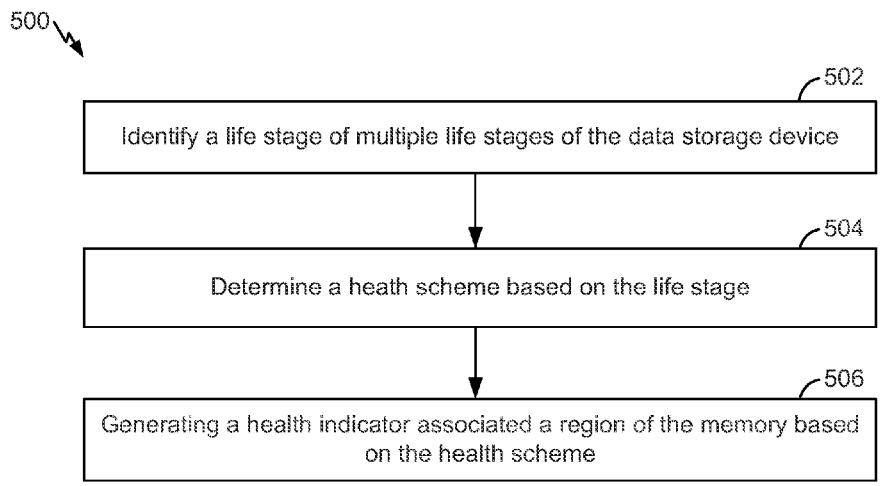
FIG. 5 is a flow diagram that illustrates a particular example of a method of operation of the data storage device of FIG. 1.

Referring to FIG. 5, a particular illustrative embodiment of a method is depicted and generally designated 500. The method 500 may be performed at the data storage device 102, such as by the health meter 184, the selector 188, the controller 120, or a combination thereof, as illustrative, non-limiting examples.

The method 500 includes identifying a life stage of multiple life stages of the data storage device, at 502. The life stage may be identified by a health meter, such as the health meter of FIG. 1. The life stage may be identified based on a program/erase cycle metric, based on an amount of data written metric, based on an amount of data received metric, or a combination thereof. After the life stage is identified, an indication of the identified life stage may be sent to a host device, such as the host device 150 of FIG. 1, that is communicatively coupled to the data storage device. In some implementations, the multiple life stages may include two distinct life stages. Two life stages may be distinct if the life stages do not overlap in time (e.g., a first life stage begins and ends prior to a second life). In other implementations, the multiple life stages may include more than two distinct life stages.

The method 500 also includes determining a health scheme based on the life stage, at 504. For example, the health scheme may be selected by the health meter 184 of FIG. 1. In some implementations, determining the health scheme may include selecting the health scheme from a plurality of health schemes based on the life stage. The plurality of health schemes may include or correspond to the health schemes 187 of FIG. 1.

The method 500 also includes generating a health indicator associated with a region of a memory based on the selected health scheme, at 506. For example, the health indicator may be generated by the health meter 184 of FIG. 1. The health indicator may provide an indication of a health status of the region. The memory may include or correspond to the memory 104 of FIG. 1. In some implementations, the memory may include a three-dimensional (3D) memory configuration that is monolithically formed in one or more physical levels of arrays of memory cells having an active area disposed above a silicon substrate, and wherein the data storage device includes circuitry associated with operation of the memory cells. To generate the health indicator, the health scheme may use one or more values corresponding to a failed bit count metric, a program/erase count metric, a trim index value metric, or a combination thereof. The health indicator may be included in the output 186 of FIG. 1. In some embodiments, the failed bit count, the program/erase count, and the trim index value may correspond to a block of the memory, such as one of the blocks 142-146 of the memory 104 of FIG. 1. In other embodiments, the failed bit count, the program/erase count, and the trim index value may correspond to a die of the memory, such as a particular die of the one or more dies 103 of the memory 104 of FIG. 1.

In some implementations, after the first health indicator is generated, the first health indicator may be stored at a table. The table may be configured to track a corresponding health indicator for each region of a plurality of regions of the memory. The plurality of regions of the memory may include or correspond to multiple storage elements, multiple pages, multiple wordlines, multiple blocks, multiple dies, multiple meta blocks, or a combination thereof, of the memory. Additionally, before or after storing the first health indicator at the table, the first health indicator may be sent to a host device, such as the host device 150 of FIG. 1, that is communicatively coupled to the data storage device.

In some implementations, the region of the memory may be selected based on the health indicator. To illustrate, a request to perform a memory operation may be received (or generated) at a controller of the data storage device. For example, the memory operation may include or correspond to a write operation, a wear leveling operation, or a garbage collection operation, as illustrative, non-limiting examples. In response to the request, the region may be selected for the memory operation based on a comparison of a value of the health indicator and a value of another health indicator (e.g., a least one health indicator). For example, the region may be selected by a selector, such as the selector 188 of FIG. 1. In some implementations, the region may be selected from a group of one or more regions that are available for data to have data written thereto, such as a pool of free blocks that are available for memory operations. After the region is selected, a memory operation, such as the first life stage memory operation 162 or the second life stage memory operation 164 of FIG. 1, may be initiated at the region. Accordingly, the selector may select a healthy region of the memory to be used to execute the requested memory operation.

In some implementations, the multiple life stages may include a first life stage and a second life stage. To illustrate, the second life stage may occur subsequent to the first life stage. The second life stage of the multiple life stages may be identified and a second health scheme may be selected based on the second life stage. For example, the second health scheme may be different than the health scheme (e.g., a first health scheme). Based on the second health scheme, a second health indicator associated with the region may be generated.

The first life stage may corresponds to a first set of weight values of the multiple sets of weight values, and the second life stage may correspond to a second set of weight values of the multiple sets of weight values. For example, the health scheme may define the first set of weight values and the second health scheme may define the second set of weight values. The first set of weight values may include a first weight value that corresponds to a program/erase cycle metric and may include a second weight value that corresponds to a failed bit count metric. The first weight value may be greater than the second weight value. In some implementations, the first set of weight values may include a third weight value that corresponds to a trim index value metric. The third weight value may be greater than the first weight value. The second set of weight values may include a fourth weight value that corresponds to a program/erase cycle metric and a fifth weight value that corresponds to a failed bit count metric. The fifth weight value may greater than the fourth weight value. In some implementations, the second set of weight values may include a sixth weight value that corresponds to a trim index value metric. The fifth weight value may be greater than the sixth weight value.

By determining a life stage associated with the memory, the controller may dynamically determine the one or more health indicators based on changing operating conditions associated with the data storage device as indicated by the life stage of the memory. The controller may utilize the dynamically determined health indicators to select one or more regions of the memory to be used in order to reduce power consumption, shorten program and erase times, and increase data retention and reliability associated with the memory.

Figure 6:
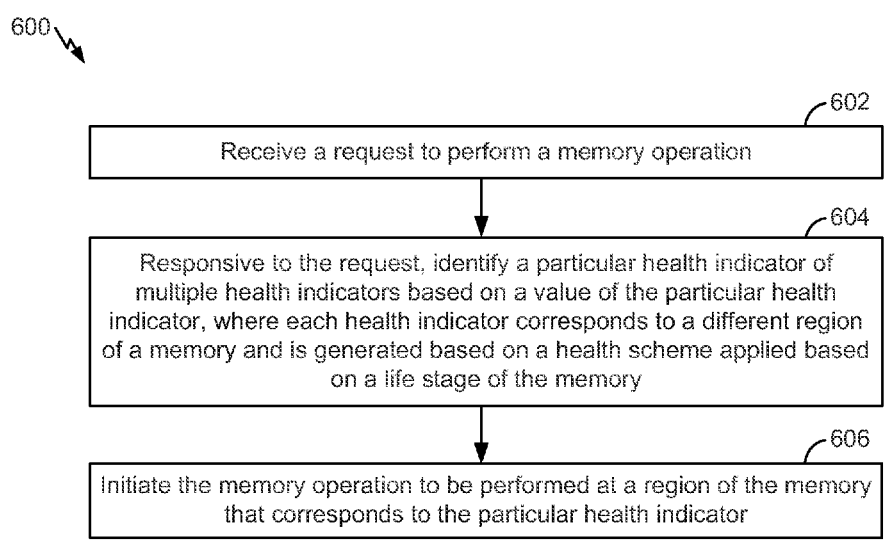
FIG. 6 is a flow diagram that illustrates another particular example of a method of operation of the data storage device of FIG. 1.

Referring to FIG. 6, a particular illustrative embodiment of a method is depicted and generally designated 600. The method 600 may be performed at the data storage device 102, such as by the health meter 184, the selector 188, the controller 120, or a combination thereof, as illustrative, non-limiting examples.

The method 600 includes receiving a request to perform a memory operation, at 602. For example, the request may be received at a controller or a selector of the data storage device, such as the controller 120 or the selector 188 of FIG. 1. The request may be generated by a controller or received from a host device, such as the host device 150 of FIG. 1. The memory operation may include or correspond to a write operation, a wear leveling operation, a garbage collection operation, or a background operation, as illustrative, non-limiting examples. The memory operation may be requested to be performed on a memory, such as the memory 104 of FIG. 1. In some implementations, the memory may include a three-dimensional (3D) memory configuration that is monolithically formed in one or more physical levels of arrays of memory cells having an active area disposed above a silicon substrate, and wherein the data storage device includes circuitry associated with operation of the memory cells.

The method 600 also includes, responsive to the request, identifying a particular health indicator of multiple health indicators based on a value of the particular health indicator, where each health indicator corresponds to a different region of the memory and is generated based on a health scheme applied based on a life stage of the memory, at 604. For example, the particular health indicator may be identified by a selector, such as the selector 188 of FIG. 1. The particular health indicator may be selected based on the particular health indicator indicating a "healthiest" region of multiple regions that correspond to the multiple health indicators. Alternatively, or in addition, the particular health indicator may be selected based on the value of the particular health indicator being greater than or equal to a threshold value. The multiple health indicators may be generated by a health meter, such as the health meter 184 of FIG. 1. The health meter may apply a health scheme that is selected from multiple health schemes, such as the health schemes 178 of FIG. 1.

The method 600 also includes initiating the memory operation to be performed at a region of the memory that corresponds to the particular health indicator, at 606. For example, the memory operation may include or correspond to the first life stage memory operation 162 or the second life stage memory operation 164 of FIG. 1. The region of the memory may include or correspond to one or more storage elements, one or more pages, one or more wordlines, one or more blocks, one or more dies, one or more meta blocks, or a combination thereof.

In some implementations, in response to receiving the request, one or more regions of the memory that are available to have data written thereto may be identified. For example, the one or more regions may be identified based on a free region pool, such as a free block pool that identifies free (e.g., available) regions of the memory. A set of health indicators may be identified from multiple health indicators. The set of health indicators may include a corresponding health indicator for each of the one or more regions. A particular health indicator that indicates a healthiest region of the one or more regions may be identified and the memory operation may be performed at the region. For example, when the memory operation is the write operation, data may be written to the region. As another example, when the memory operation is the garbage collection operation, data from one or more other regions of the memory may be copied to the region based on the garbage collection operation. As another example, when the operation is the wear leveling operation, data from a second region of the memory may be copied to the region based on the wear leveling operation. As another example, when the operation is a background operation, data associated with the background operation may be stored at the region.

By using health indicators that are generated based on a life stage of the memory, the data storage device may dynamically generate health indicators that reflect changing operating conditions associated with the data storage device and changing priorities associated with a manner in which the memory is accessed (e.g., utilized). The data storage device may rely on the dynamically generate health indicators to determine (e.g., identify) portions of the memory to be utilized during a particular life stage of the memory, such as one or more regions to be used for a memory operation.

Figure 7:
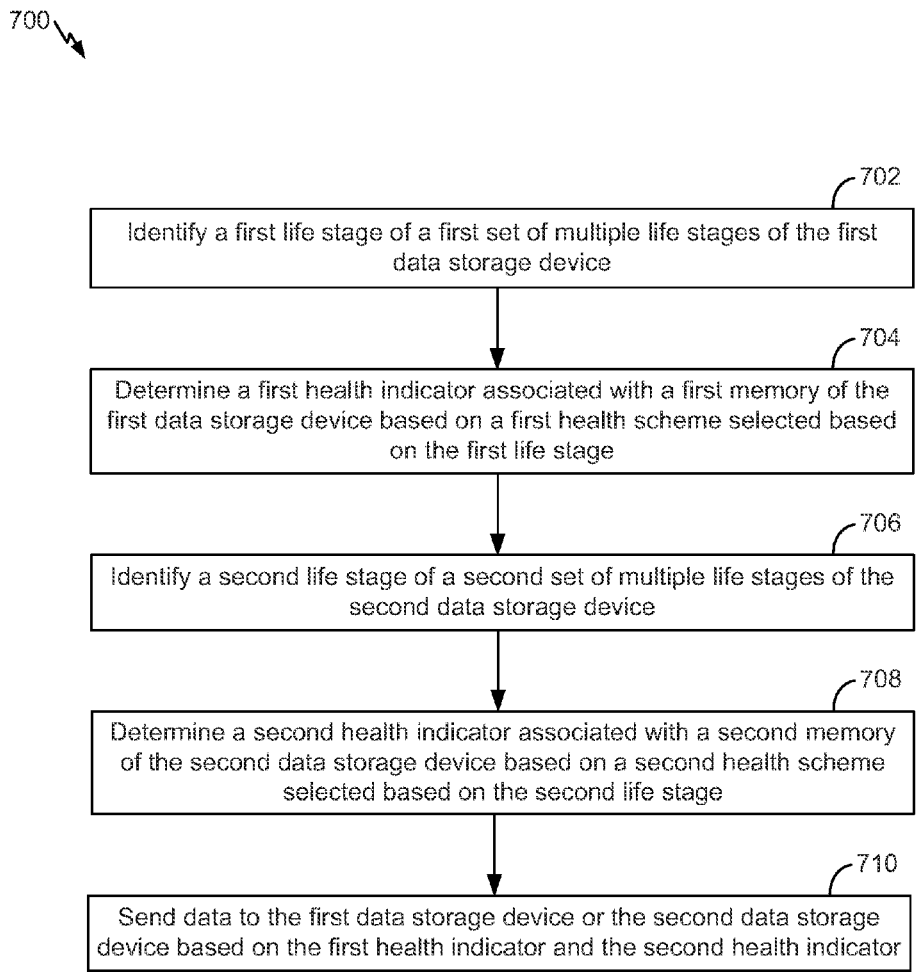
FIG. 7 is a flow diagram that illustrates a particular example of a method of operation of the host device of FIG. 2.

Referring to FIG. 7, a particular illustrative embodiment of a method is depicted and generally designated 700. The method 700 may be performed at the host device 250, such as by the health meter 284, the selector 288, the controller 270, or a combination thereof, as illustrative, non-limiting examples.

The method 700 includes identifying a first life stage of a first set of multiple life stages of the first data storage device, at 702. For example, the first life stage may be identified by the health meter 284 of FIG. 2. The first data storage device may include or correspond to the data storage device 202 of FIG. 2.

The method 700 also includes determining a first health indicator associated with a first memory of the first data storage device based on the first life stage, at 704. For example, the health meter 284 of FIG. 2 may determine the first health indicator. An indication of the first health indicator may be included in the output 286 of FIG. 2.

The method 700 also includes identifying a second life stage of a second set of multiple life stages of the second data storage device, at 706. For example, the second life stage may be identified by the health meter 284 of FIG. 2. The second data storage device may include or correspond to the data storage device 204 of FIG. 2.

The method 700 also includes determining a second health indicator associated with a second memory of the second data storage device based on the second life stage, at 708. For example, the health meter 284 of FIG. 2 may determine the second health indicator. An indication of the second health indicator may be included in the output 286 of FIG. 2.

The method 700 also includes sending data to the first data storage device or the second data storage device based on the first health indicator and the second health indicator, at 710. The data may include or correspond to the user data 290 of FIG. 2. A selector, such as the selector 288, may be configured to determine which of the first data storage device or the second data storage device is to receive the data based on the first health indicator and the second health indicator.

In some implementations, a first amount of data sent to the first data storage device for storage and a second amount of data sent to the second data storage device for storage may be tracked. For example, metric tracker, such as the metric tracker 272 of FIG. 2, may be configured to track the first amount and the second amount.

In some implementations, first performance data may be received at a host device, such as the host device 250 of FIG. 2, from the first data storage device. The first performance data may include an indication of a life stage of the first data storage device. Alternatively, or in addition, the first performance data may include one or more metrics associated with the first memory, such as a program/erase cycle metric, a failed bit count metric, a trim index metric, an amount of received data metric, an amount of data written metric, a program time metric, an erase time metric, a number of pulses to program metric, a number of pluses to erase metric, or a combination thereof, as illustrative, non-limiting examples.

By determining a life stage associated with each of the first data storage device and the second data storage device, the host device may dynamically determine one or more health indicators for each of the first data storage device and the second data storage devices. Based on the health indicators for the first and second data storage devices, the host device may identify a particular data storage device having a greater endurance and/or a greater reliability. Accordingly, the host device may route data to the particular data storage device using the dynamically determined health indicators that are based on the life stages for each of the first and second data storage devices.

The method 500 of FIG. 5, the method 600 of FIG. 6, and/or the method 700 of FIG. 7 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 500 of FIG. 5, the method 600 of FIG. 6, and/or the method 700 of FIG. 7 can be initiated or controlled by one or more processors, such as one or more processors included in or coupled to a controller or a memory of the data storage device 102, the host device 150 of FIG. 1, the data storage device 202, the data storage device 204, and/or the host device 250 of FIG. 2. A controller configured to perform the method 500 of FIG. 5, the method 600 of FIG. 6, and/or the method 700 of FIG. 7 may be able to determine and/or detect one or more health indicators associated with a memory of a storage device.

In an illustrative example, a processor may be programmed to identify a life stage of multiple life stages of the data storage device. For example, the processor may execute instructions to access metric data and to compare the metric data to one or more threshold values (or threshold ranges) to determine the life stage. The processor may further execute instructions to determine a health scheme based on the life stage. For example, the processor may execute instructions to access a plurality of health schemes and to identify a particular health scheme based on the identified life stage (which may be used as an index value). The processor may further execute instructions to generate a health indicator associated with a region of the memory based on the health scheme. For example, the processor may execute instructions to access one or more metrics, and to execute the health scheme using values of the one or more metrics.

In another illustrative example, a processor may be programmed to receive a request to perform a memory operation. For example, the processor may execute instructions to detect a received request, to parse the request to identify an op code, and to identify a type of memory operation based on the op code. The processor may further execute instructions to, responsive to the request, identify a particular health indicator of multiple health indicators based on a value of the particular health indicator, where each health indicator corresponds to a different region of the memory and is generated based on a health scheme selected based on a life stage of the memory. The particular health indicator may be selected based on the particular health indicator indicating a "healthiest" region of multiple regions that correspond to the multiple health indicators. Alternatively, or in addition, the particular health indicator may be selected based on the value of the particular health indicator being greater than or equal to a threshold value. For example, the processor may execute instructions to access an available region pool (e.g. a free region list), to determine a health indicator for each region identified in the available region pool, and to identify a healthiest available region based on sorted health indicators. The processor may further execute instructions to initiate the memory operation to be performed at a region of the memory that corresponds to the particular health indicator. For example, the processor may execute instructions to generate a memory operation command based on the request and to send the memory operation command to the memory.

In another illustrative example, a processor may be programmed to identify a first life stage of a first set of multiple life stages of the first data storage device and to identify a second life stage of a second set of multiple life stages of the second data storage device. For example, the processor may execute instructions to access metric data and to compare the metric data to one or more threshold values (or threshold ranges) to determine a life stage. The processor may further execute instructions to determine a first health indicator associated with a first memory of the first data storage device based on a first health scheme selected based on the first life stage and to determine a second health indicator associated with a second memory of the second data storage device based on a second health scheme selected based on the second life stage. For example, the processor may execute instructions to access a health meter formula, to access one or more metrics, to access a set of one or more weight values, and/or to execute the formula using the one or more metrics. The processor may further execute instructions to send data to the first data storage device or the second data storage device based on the first health indicator and the second health indicator. For example, the processor may execute instructions to compare multiple health indicators, to sort the multiple health values, to identify a particular health value having a particular health value (e.g., a maximum health value), to generate a write command, and to send the write command.

Although various components of the data storage device 102, the host device 150 of FIG. 1, the data storage device 202, the data storage device 204, and/or the host device 250 of FIG. 2 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 500 of FIG. 5, the method 600 of FIG. 6, and/or the method 700 of FIG. 7. In a particular implementation, each of the controller 120, the memory 104, and the host 150 of FIG. 1, the data storage device 202, the data storage device 204, the controller 270, and/or the memory 254 of FIG. 2 includes a processor executing instructions that are stored at a memory, such as a non-volatile memory of the data storage device 102, the host device 150 of FIG. 1, the data storage device 202, the data storage device 204, or the host device 250 of FIG. 2. Alternatively or additionally, executable instructions that are executed by the processor may be stored at a separate memory location that is not part of the non-volatile memory, such as at a read-only memory (ROM) of the data storage device 102, the host device 150 of FIG. 1, the data storage device 202, the data storage device 204, or the host device 250 of FIG. 2.

With reference to FIG. 1, the data storage device 102 may be attached to or embedded within one or more host devices, such as within a housing of a host communication device (e.g., the host device 150). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 may be implemented in a portable device configured to be selectively coupled to one or more external host devices.

To further illustrate, the data storage device 102 may be configured to be coupled to the host device 150 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 of FIG. 1 (and/or the memory 254 of FIG. 2) may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 may include another type of memory. The memory 104 of FIG. 1 and/or the memory 254 of FIG. 2 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   means for storing information, the means for storing associated with metrics; and
   means for controlling the means for storing, the means for controlling configured to:
      detect a life-stage change of the means for storing based on the metrics;
      modify weights for the metrics based on the life-stage change by increasing a weight corresponding to a failed bit count metric and decreasing a weight corresponding to a program/erase cycle metric;
      determine a health scheme based on the weights;
      generate a health indicator associated with a region of the means for storing based on the health scheme; and
      perform memory operations on regions of the means for storing based on the health scheme such that regions having a lower failed bit count metric than one or more other regions are selected for the memory operations in response to detecting the life-stage change.

2. The device of claim 1, wherein the means for controlling is further configured to identify a life stage based on at least one of the program/erase cycle metric, an amount of data written metric, and an amount of data received metric.

3. The device of claim 1, wherein the means for controlling is further configured to:
   identify a first life stage and determine a second health scheme based on a second life stage, the second health scheme different than the health scheme; and
   generate a second health indicator associated with the region based on the second health scheme.

4. The device of claim 3, wherein the second life stage occurs subsequent in time to the first life stage, and wherein the means for controlling is further configured to select the health scheme from a plurality of health schemes based on the first life stage.

5. The device of claim 1, wherein the means for controlling is further configured to select a life stage from more than two distinct life stages.

6. The device of claim 1, wherein the health scheme is associated with a set of weight values to be applied, by the means for controlling, to a set of metrics to determine a value that corresponds to the health indicator.

7. The device of claim 6, wherein the set of metrics comprises at least one of the failed bit count metric, the program/erase count cycle metric, and a trim index value.

8. The device of claim 1, wherein the means for controlling is further configured, in response to receiving a request to perform a memory operation, to select the region for the memory operation based a comparison of a value of the health indicator and a value of another health indicator and to initiate the memory operation to be performed at the region.

9. The device of claim 8, wherein the memory operation is associated with at least one of a write operation, a wear leveling operation, and a garbage collection operation.

10. The device of claim 1, wherein the means for controlling is further configured to:
    store the health indicator at a table, the table configured to track a corresponding health indicator for each region of a plurality of regions of the means for storing; and
    after the first health indicator is stored at the table, send the health indicator to a host device.

11. The device of claim 1, wherein the means for storing comprises a three-dimensional (3D) memory configuration that is monolithically formed in one or more physical levels of arrays of memory cells having an active area disposed above a silicon substrate, and wherein the device comprises circuitry associated with operation of the memory cells.

12. A data storage device comprising:
    a memory comprising multiple storage elements; and
    a controller coupled to the memory, the controller comprising logic hardware, the controller configured to:
       track at least one metric associated with the memory;
       detect, based on the at least one metric, a transition from a first life stage of the memory to a second life stage of the memory;
       modify at least one weight value associated with a health scheme based on the transition by increasing a weight value corresponding to a failed bit count metric and decreasing a weight value corresponding to a program/erase cycle metric; and
       performing memory operations on blocks of the memory, the blocks selected for the memory operations based on the modified at least one weight value such that blocks having a lower failed bit count metric than one or more other blocks are selected for the memory operations during the second life stage.

13. The data storage device of claim 12, wherein the controller is further configured to detect the transition based on the program/erase cycle metric.

14. The data storage device of claim 12, wherein the controller is further configured to determine a health value corresponding to at least one storage element of the memory based on the modified at least one weight values.

15. The data storage device of claim 12, wherein the at least one metric further comprises at least one of a trim value, a bit error rate, a program time, an erase time, a number of voltage pulses to program a storage element of the multiple storage elements, and a number of voltage pulses to erase the storage element.

16. The data storage device of claim 12, wherein modifying the at least one weight value improves the use of the memory by one or more of reducing power consumption, shortening a program time, shortening an erase time, increasing data retention, increasing reliability, and increasing operating life of the memory.

17. The data storage device of claim 12, wherein the first life stage is associated with a first set of weight values, wherein the first set of weight values comprises a first weight value corresponding to the program/erase cycle metric and a second weight value corresponding to the failed bit count metric, and wherein the first weight value is greater than the second weight value.

18. The data storage device of claim 17, wherein the first set of weight values comprises a third weight value corresponding to a trim index value metric, and wherein the third weight value is greater than the first weight value.

19. The data storage device of claim 12, wherein:
    the second life stage corresponds to a set of weight values,
    the set of weight values includes comprises:
       a first weight value corresponding to the program/erase cycle metric, a second weight value corresponding to the failed bit count metric, and
a third weight value corresponding to a trim index value metric, and
the second weight value is greater than the first weight value and greater than the third weight value.

20. The data storage device of claim 12, wherein the memory comprises a three-dimensional (3D) memory configuration that is monolithically formed in one or more physical levels of arrays of memory cells having an active area disposed above a silicon substrate, and wherein the memory comprises circuitry associated with operation of the memory cells.

21. A method comprising:
receiving a request to perform a memory operation on a memory;
responsive to the request, identifying a particular health indicator of multiple health indicators based on a value of the particular health indicator, wherein each health indicator corresponds to a different region of the memory and is generated based on a health scheme applied based on a life stage of the memory;
initiating the memory operation to be performed at a region of the memory that corresponds to the particular health indicator;
modifying weights for the particular health indicator for a subsequent life stage of the memory by increasing a weight corresponding to a failed bit count metric and decreasing a weight corresponding to a program/erase count metric; and
initiating a subsequent memory operation to be performed at another region of the memory, the other region selected for the subsequent memory operation based on the modified weights such that the other region has a lower failed bit count metric than the region of the memory.

22. The method of claim 21, wherein the memory operation is associated with at least one of a write operation, a wear leveling operation, and a garbage collection operation.

23. The method of claim 21, further comprising, when the memory operation is a write operation:
identifying at least one region of the memory that is available for the write operation;
identifying a set of health indicators from the multiple health indicators, the set of health indicators comprising a corresponding health indicator for each region of the one at least one region;
identifying the particular health indicator as indicating a healthiest region of the at least one region; and
performing the write operation at the region.

24. The method of claim 21, further comprising, when the memory operation is a garbage collection operation:
identifying at least one region of the memory that is available for a write operation;
identifying a set of health indicators from the multiple health indicators, the set of health indicators comprising a corresponding health indicator for each region of the at least one region;
identifying the particular health indicator as indicating a healthiest region of the at least one region; and
performing the garbage collection operation, wherein data from at least one other region of the memory is copied to the region based on the garbage collection operation.

25. The method of claim 21, further comprising, when the memory operation is a wear leveling operation:
identifying at least one region of the memory that is available for a write operation;
identifying a set of health indicators from the multiple health indicators, the set of health indicators comprising a corresponding health indicator for each region of the at least one region;
identifying the particular health indicator as indicating a healthiest region of the at least one region; and
performing the wear leveling operation, wherein data from a second region of the memory is copied to the region based on the wear leveling operation.

26. The method of claim 21, wherein the memory comprises a three-dimensional (3D) memory configuration that is monolithically formed in one or more physical levels of arrays of memory cells having an active area disposed above a silicon substrate, and wherein the memory comprises circuitry associated with operation of the memory cells.

27. A method comprising:
identifying a first life stage of a first data storage device;
determining a first health value associated with a first memory of the first data storage device based on a first health scheme selected based on the first life stage;
identifying a second life stage of a second data storage device;
determining a second health value associated with a second memory of the second data storage device based on a second health scheme selected based on the second life stage;
selecting one of the first data storage device and the second data storage device based on the first health value and the second health value for a write operation;
modifying weights for at least one of the first health value and the second health value for a subsequent life stage by increasing a weight corresponding to a failed bit count metric and decreasing a weight corresponding to a program/erase cycle metric; and
selecting, in the subsequent life stage, a different one of the first data storage device and the second data storage device for a subsequent write operation based on the modified weights such that the different one of the first and second storage device has a lower failed bit count metric than the other one of the first and second data storage device.

28. The method of claim 27, further comprising:
tracking a first amount of data sent to the first data storage device for storage; and
tracking a second amount of data sent to the second data storage device for storage.

29. The method of claim 27, further comprising receiving performance data from the first data storage device, the performance data comprising at least one metric associated with the first memory, wherein the at least one metric comprises at least one of the program/erase cycle metric, the failed bit count metric, a trim index metric, an amount of received data metric, an amount of data written metric, a program time metric, an erase time metric, a number of pulses to program metric, and a number of pulses to erase metric.

30. The method of claim 27, further comprising receiving performance data from the second data storage device, the performance data comprising an indication of the second life stage of the second data storage device.

* * * * *